(12) United States Patent
Oka et al.

(10) Patent No.: US 6,265,042 B1
(45) Date of Patent: Jul. 24, 2001

(54) ADHESIVE TAPE FOR ELECTRONIC PARTS

(75) Inventors: Osamu Oka; Takeshi Nishigaya, both of Shizuoka (JP)

(73) Assignee: Tomoegawa Paper Co., Ltd., Tokyo (JP)

(*) Notice: Subject to any disclaimer, the term of this patent is extended or adjusted under 35 U.S.C. 154(b) by 0 days.

(21) Appl. No.: 09/150,036

(22) Filed: Sep. 9, 1998

(30) Foreign Application Priority Data

Sep. 17, 1997 (JP) .................................................. 9-251775

(51) Int. Cl.$^7$ ........................................................ B32B 7/12
(52) U.S. Cl. .................. 428/40.1; 428/40.2; 428/41.8; 428/323; 428/473.5
(58) Field of Search ................. 428/40.1, 40.2, 428/41.81, 473.5, 323

(56) References Cited

U.S. PATENT DOCUMENTS 5,527,621 * 6/1996 Matsuura ........................ 428/473.5

FOREIGN PATENT DOCUMENTS

| 6-207024 | * 7/1994 | (JP) . |
| 8-325533 | 12/1996 | (JP) . |
| 9-40931 | 2/1997 | (JP) . |
| 9-67559 | 3/1997 | (JP) . |

* cited by examiner

Primary Examiner—Nasser Ahmad
(74) Attorney, Agent, or Firm—McDermott, Will & Emery

(57) ABSTRACT

An adhesive tape for electronic parts of the present invention is characterized by comprising a heat resisting film and an adhesive layer provided on at least a side of said heat resisting film, said adhesive layer contains at least a polyimide comprising 100–30% by mol of at least one of the repeating units represented by the following formulas (1a) and (1b) and 0–70% by mol of at least one of the repeating unit represented by the following formulas (2a) and (2b) and 0.1–15 parts by weight of a silane coupling agent based on 100 parts by weight of said polyimide:

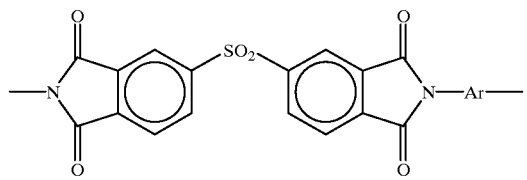

(1a)

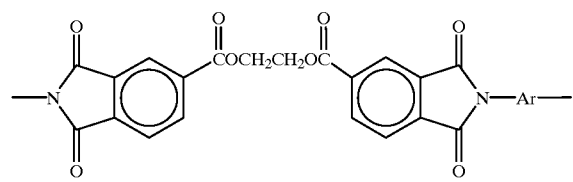

(1b)

wherein Ar represents a specified divalent aromatic group

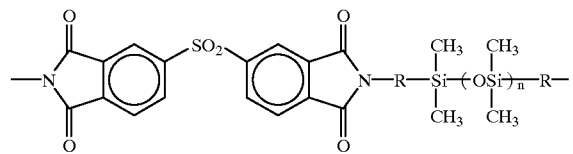

(2a)

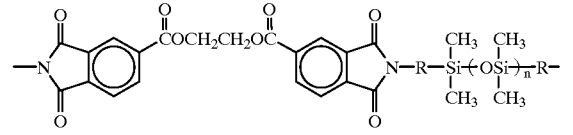

(2b)

wherein R is an alkylene group having 1 to 10 carbon atoms or —$CH_2OC_6H_4$—, the methylene group of which attaches to Si, and n means an integer of 1 to 20.

5 Claims, 2 Drawing Sheets

ADHESIVE TAPE FOR ELECTRONIC PARTS

BACKGROUND OF THE INVENTION

1. Field of the Invention

The present invention relates to an adhesive tape for electronic parts to be used as TAB tapes, adhesive tapes for fixing the leadframe or for adhering between parts around leadframes making up a semiconductor device, e.g., lead pins, semiconductor chip mounted substrates, heat spreader, semiconductors themselves.

2. Description of the Related Art

Conventionally, adhesive tapes for fixing a leadframe, TAB tapes, etc., are used as adhesive tapes for use in the interior of resin-molded type semiconductor devices. For example, the adhesive tapes for fixing a leadframe have been used to fix lead pins of the leadframe in order to enhance the efficiency for producing the leadframe itself and the whole semiconductor assembly stages. In general, a leadframe manufacturer tapes the leadframe, and brings it to a semiconductor manufacturer, at which a semiconductor chip is mounted thereon followed by molding the leadframe with a resin. For this reason, it has been required for the adhesive tapes for fixing the leadframe not only to possess general reliability in a level required for semiconductor and enough processability at the time of taping, but also to possess sufficient adhesive strength at room temperature immediately after taping and heat resistance enough for withstanding thermal process at the stages of assembling semiconductor devices.

Conventionally, the adhesive tapes for use in such an problems that the generated gas stains the lead to cause deterioration of the adhesive strength or causes generation of package crack, because of insufficient heat resistance. It is therefore required to develop adhesives for electronic parts having sufficient heat resistance and reliability and adhesive tapes for electronic parts using them.

The present inventors have solved before the above problems by inventing adhesive tapes using an adhesive containing a polyimide composed of repeating units represented by the below-described formulas (1a), (1b), (2a) and (2b). (Japanese Patent Application Laid-open Nos. 325533/1996 and 67559/1997).

These adhesive tapes however have other problems. For example, there is a problem of easily causing interfacial separation of the adhesive layer from the heat resistant film in the case that the adhesive layer is formed on the heat resisting film. In particular, the interfacial separation at high humidity and high temperature becomes a serious problems because of causing remarkable deterioration of reliability of semiconductor packages. Moreover, there is a problem because of requiring two stages for bonding that it is not possible to prevent shifting or distortion of the lead pins, because the resin bonded by the first bonding stage softens by heating during the second bonding stage.

A both-sided adhesive tape in which adhesive layers having each a different glass transition temperature are provided on both sides of an insulating base film has been proposed for dissolving the above described problems. However, the both-sided adhesive tape has a drawback of causing warp of the leadframe because of the difference of thermal expansion application include adhesive tapes applying on a support film of a polyimide film, etc., an adhesive comprising polyacrylonitrile, polyacrylate or a synthetic rubber resin such as acrylonitrile-butadiene copolymer solely, or modified with any other resin or blended with any other resin to come into a B-stage. Both-sided adhesive tapes using thermoplastic polyimide resin having high reliability and high heat resistance have been utilized recently.

In recent years, resin-molded type semiconductor devices (semiconductor packages) as shown in FIGS. 1–3 have been developed and produced. In FIG. 1, the device has a construction in which lead pins 3 and metal plane 2 are connected by means of an adhesive layer 6, a semiconductor chip 1 is mounted on the metal plane 2, and bonding wires 4 between the semiconductor chip 1 and the lead pins 3, they are molded with a resin 5. In FIG. 2, the device has a construction in which the lead pins 3 and the semiconductor chip 1 are connected by means of an adhesive layer 6 and they are molded with a resin 5. In FIG. 3, the device has a construction in which the semiconductor chip 1 is mounted on a die pad 7, electrodes 8 and the die pad are connected by means of the adhesive layers 6, the semiconductor chip 1 is electrically connected to the electrodes 8 and the electrodes 8 are electrically connected to the lead pins 3 by means of bonding wires 4, and they are molded with a resin 5. In these cases, in general, single-layer adhesive tapes or both-sided adhesive tapes are used for the adhesive layer 6.

In the adhesive layers in the resin-molded type semiconductor devices shown in FIGS. 1–3, the use of an adhesive tape to which a conventional adhesive is applied has the between resins on both sides. Further, in the case of an adhesive tape consisting only of an adhesive layer, there is the problem that insulation becomes difficult to assure when the tape is bonded under pressure with heat, because the leadframe is embedded in and pierces the adhesive layer.

When an adhesive having a low glass transition temperature is used for satisfying the requirement for bonding at a lower temperature, adhesive strength at a high temperature becomes difficult to assure.

Japanese Patent Application Laid-open No. 40931/1997 discloses a varnish comprising a polyimide composed of 2,2-bisphthalic hexafluoroisopropylidene dianhydride, 4,4'-diamino-3,3',5,5'-tetraisopropyldiphenyl methane and siloxanediamine, to which a silane coupling agent is added. Since this adhesive is not the tape but is varnish, patterning on the chip is required and consequently the production processes becomes complicated. Moreover, there is a problem that poor wire-bonding is easily caused because of having no base film.

The present invention has been made for the purpose of solving such problems in the prior arts. Namely, an object of the present invention is to provide an adhesive tape for electronic parts capable of adhesion at a relatively low temperature without causing interfacial separation, with keeping electrical insulation and having sufficient reliability.

SUMMARY OF THE INVENTION

The adhesive tape for electronic parts of the present invention is characterized by comprising a heat resisting film and an adhesive layer provided on at least a side of said heat resisting film, said adhesive layer comprises at least a polyimide comprising 100–30% by mol of at least one of the repeating units represented by the following formulas (1a) and (1b) and 0–70% by mol of at least one of the repeating units represented by the following formulas (2a) and (2b) and 0.1–15 parts by weight of a silane coupling agent based on 100 parts by weight of said polyimide:

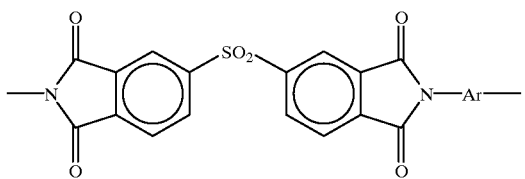

(1a)

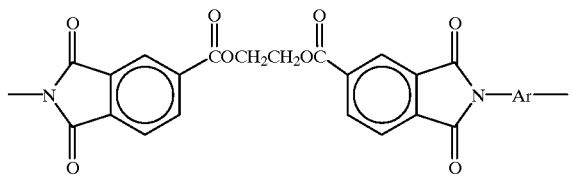

(1b)

wherein Ar represents a divalent group selected from the following formulas containing aromatic rings:

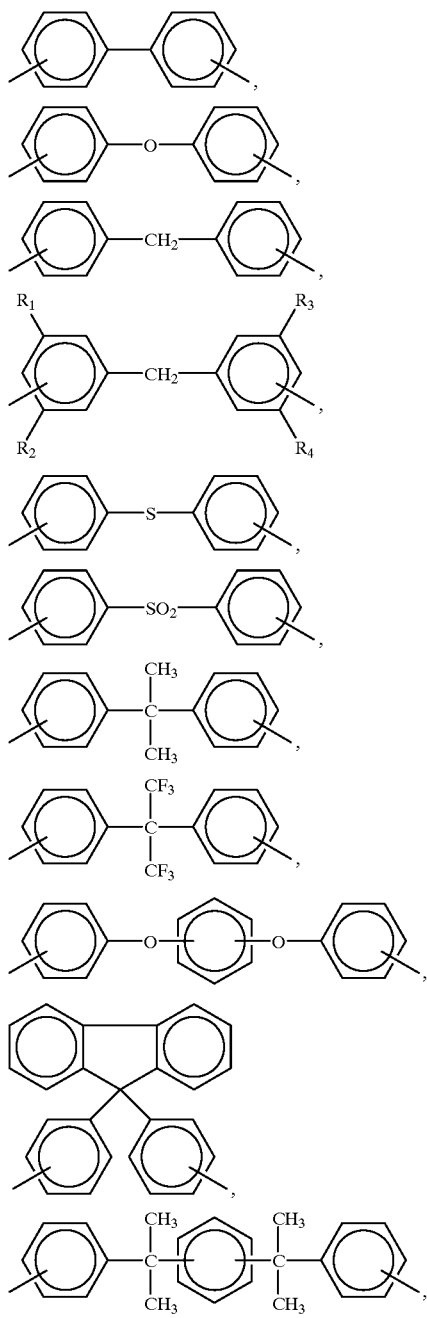

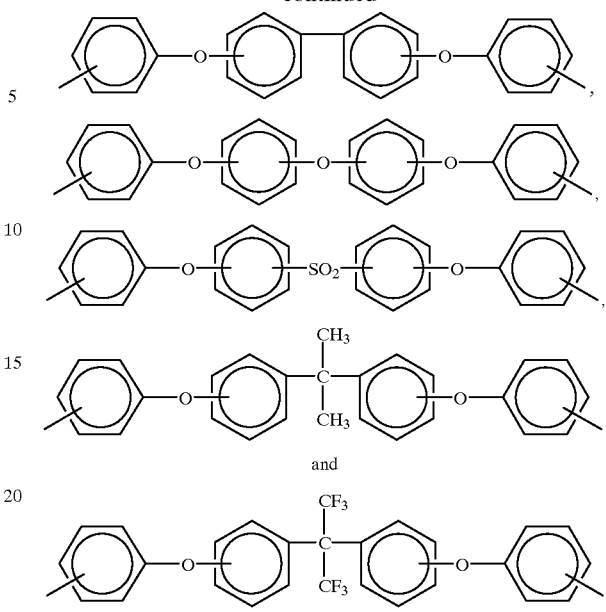

wherein $R_1$, $R_2$, $R_3$ and $R_4$ which may be identical or different represent each a hydrogen atom, an alkyl group having 1–4 carbon atoms or an alkoxy group having 1–4 carbon atoms, provided that $R_1$, $R_2$, $R_3$ and $R_4$ are not hydrogen atoms at the same time.

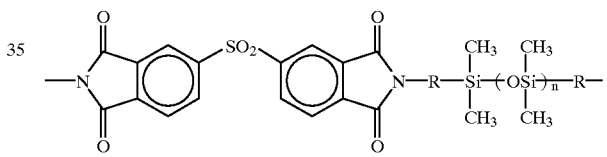

(2a)

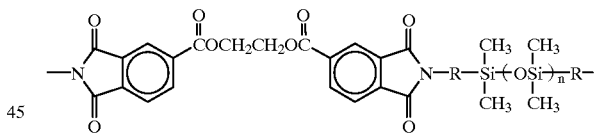

(2b)

wherein R is an alkylene group having 1 to 10 carbon atoms or —$CH_2OC_6H_4$—, the methylene group of which attaches to Si, and n means an integer of 1 to 20.

DETAILED DESCRIPTION OF PREFERRED EMBODIMENTS

Figure 1:
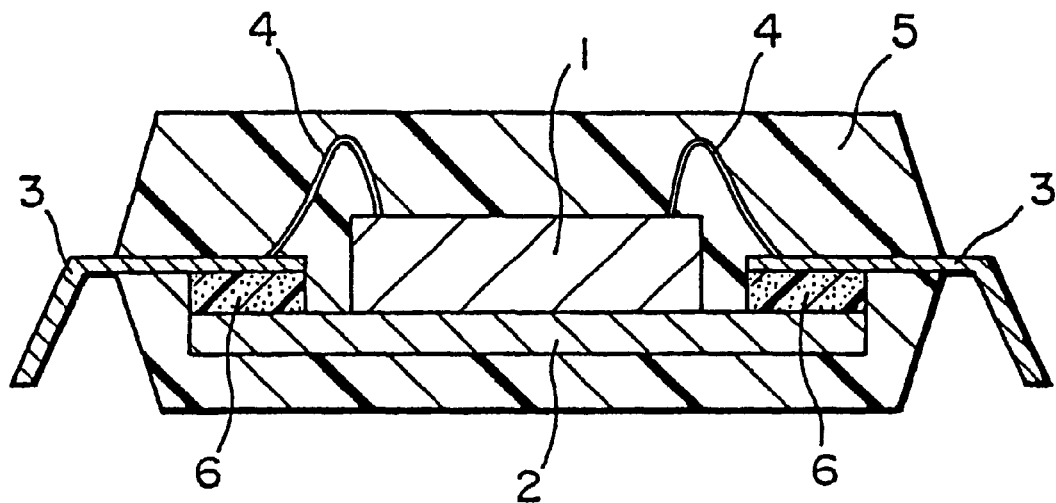
FIG. 1 is a cross-sectional view of an embodiment of a resin-molded type semiconductor device using the adhesive tape of the present invention or the prior conventional adhesive tape.

The embodiments of the present invention will now be described in detail.

The polyimide used in the adhesive tape for electronic parts of the present invention comprises 100–30% by mol of at least one of the repeating units represented by the above-mentioned formulas (1a) and (1b) and 0–70% by mol of at least one of the repeating unit represented by the above-mentioned formulas (2a) and (2b). The polyimide is preferred to contain 70% by mol or more of the repeating units represented by the formulas (1a), (1b), (2a) and (2b).

In the above described polyimide used in the present invention, the greater the proportion of the repeating units represented by the formula (1a) or (1b) is, the higher the glass transition temperature becomes, while the greater the proportion of the repeating units represented by the formulas (2a) or (2b) is, the lower the glass transition temperature becomes. Accordingly, it is possible to control the glass transition temperature of the polyimide by varying the proportion of the above-mentioned formulas, by which it becomes possible to control the temperature capable of bonding with pressure.

The adhesive layer of the adhesive tape for electronic parts of the present invention is necessary to contain 0.1–15 parts by weight of a silane coupling agent based on 100 parts by weight of the above mentioned polyimide.

The polyimides to be used in the present invention can be produced according to conventional processes for producing polyimides. In detail, they can be produced from tetracarboxylic dianhydrides corresponding to the desired repeating units and diamines or diisocyanates corresponding to the desired repeating units.

In more detail, the above mentioned polyimides can be produced by reacting 3,3',4,4'-diphenylsulfone tetracarboxylic dianhydride and ethylene glycol bistrimellitate dianhydride as tetracarboxylic dianhydrides with compounds represented by the following formulas (4) and (5). In the production, if necessary, less than 30% by mol of other acid anhydrides may be used together with the above-mentioned tetracarboxylic dianhydrides.

$$Y-Ar-Y \tag{4}$$

wherein Ar is the same meaning as described above and Y is an amino group or an isocyanate group.

$$Y-R-\underset{\underset{CH_3}{|}}{\overset{\overset{CH_3}{|}}{Si}}-(OSi)_n-R-Y \tag{5}$$

wherein R is an alkylene group having 1 to 10 carbon atoms or —$CH_2OC_6H_4$—, the methylene group of which attaches to Si, Y is an amino group or an isocyanate group, and n means an integer of 1 to 20.

Examples of other acid anhydrides which are optionally used in an amount of less than 30% by mol together with 3,3',4,4'-diphenylsulfone tetracarboxylic dianhydride and ethylene glycol bistrimellitate dianhydride in the above-mentioned polyimide of the present invention include trimellitic anhydride, pyromellitic dianhydride, 3,3',4,4'-benzophenonetetracarboxylic dianhydride, 3,3',4,4'-biphenyltetracarboxylic dianhydride, 2,3',3,4'-biphenyltetracarboxylic dianhydride, bis(3,4-dicarboxyphenyl)ether dianhydride, 4,4'-bis(3,4-dicarboxyphenoxy)diphenyl sulfone dianhydride, 2,2-bis[4-(3,4-dicarboxyphenoxy)phenyl]propane dianhydride, etc.

The compound represented by the above-mentioned formula (4) has a divalent group Ar selected from the above described structures having aromatic rings. Typical examples of the compound wherein the functional group Y is an amino group include the following diamines: 3,3'-diaminobiphenyl, 3,4'-diaminobiphenyl, 4,4'-diaminobiphenyl, 3,3'-oxydianiline, 3,4'-oxydianiline, 4,4'-oxydianiline, 3,3'-diaminodiphenylmethane, 3,4'-diaminodiphenylmethane, 4,4'-diaminodiphenylmethane,
3,3'-diamino-2,2',4,4'-tetramethyldiphenylmethane,
3,3'-diamino-2,2',4,4'-tetraethyldiphenylmethane,
3,3'-diamino-2,2',4,4'-tetrapropyldiphenylmethane,
3,3'-diamino-2,2',4,4'-tetraisopropyldiphenylmethane,
3,3'-diamino-2,2',4,4'-tetrabutyldiphenylmethane,
3,4'-diamino-2,3',4,5'-tetramethyldiphenylmethane,
3,4'-diamino-2,3',4,5'-tetraethyldiphenylmethane,
3,4'-diamino-2,3',4,5'-tetrapropyldiphenylmethane,
3,4'-diamino-2,3',4,5'-tetraisopropyldiphenylmethane,
3,4'-diamino-2,3',4,5'-tetrabutyldiphenylmethane,
4,4'-diamino-3,3',5,5'-tetramethyldiphenylmethane,
4,4'-diamino-3,3',5,5'-tetraethyldiphenylmethane,
4,4'-diamino-3,3',5,5'-tetrapropyldiphenylmethane,
4,4'-diamino-3,3',5,5'-tetraisopropyldiphenylmethane,
4,4'-diamino-3,3',5,5'-tetrabutyldipbenylmethane,
4,4'-diamino-3,3'-diethyl-5,5'-dimethyldiphenylmethane,
4,4'-diamino-3,3'-dimethyldiphenylmethane,
4,4'-diamino-3,3'-diethyldiphenylmethane,
4,4'-diamino-3,3',5,5'-tetramethoxydiphenylmethane,
4,4'-diamino-3,3',5,5'-tetraethoxydiphenylmethane,
4,4'-diamino-3,3',5,5'-tetrapropoxydiphenylmethane,
4,4'-diamino-3,3',5,5'-tetraisopropoxydiphenylmethane,
4,4'-diamino-3,3',5,5'-tetrabutoxydiphenylmethane,
4,4'-diamino-3,3'-dimethoxydiphenylmethane,
4,4'-diamino-3,3'-diethoxydiphenylmethane,
3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone,
2,2-bis(3-aminophenyl)propane, 2,2-bis(4-aminophenyl) propane, 2,2-bis(3-aminophenyl)hexafluoropropane, 2,2-bis(4-aminophenyl)hexafluroropropane, 1,3-bis(3-aminophenoxy)benzene, 1,3-bis(4-aminophenoxy) benzene,
1,4-bis(3-aminophenoxy)benzene, 1,4-bis(4-aminophenoxy)benzene, 9,9-bis(3-aminophenyl)fluorene, 9,9-bis(4-aminophenyl)fluorene, 1,3-bis[1-(3-aminophenyl)-1-methylethyl]benzene, 1,3-bis[1-(4-aminophenyl)-1-methylethyl]benzene, 1,4-bis[1-(3-aminophenyl)-1-methylethyl]benzene, 1,4-bis[1-(4-aminophenyl)-1-methylethyl]benzene, 3,3'-bis(3-aminophenoxy)biphenyl,
3,3'-bis(4-aminophenoxy)biphenyl, 3,4'-bis(3-aminophenoxy)biphenyl, 3,4'-bis(4-aminophenoxy) biphenyl,
4,4'-bis(3-aminophenoxy)biphenyl, 4,4'-bis(4-aminophenoxy)biphenyl, 3,3'-bis(3-aminophenoxy) diphenyl ether, 3,3-bis (4-aminophenoxy)diphenyl ether, 3,4'-bis(3-aminophenoxy)diphenyl ether, 3,4'-bis(4-aminophenoxy)diphenyl ether, 4,4'-bis (3-aminophenoxy)-diphenyl ether, 4,4'-bis(4-aminophenoxy)diphenyl ether,
bis[4-(3-aminophenoxy)phenyl]sulfone, bis[4-(4-aminophenoxy)phenyl]sulfone, 2,2-bis[3-(3-aminophenoxy)phenyl]propane, 2,2-bis[3-(4-aminophenoxy)-phenyl]propane, 2,2-bis[4-(3-aminophenoxy)phenyl] propane,
2,2-bis[4-(4-aminophenoxy)phenyl]propane,
2,2-bis[3-(3-aminophenoxy)phenyl]hexafluoropropane,
2,2-bis[3-(4-aminophenoxy)phenyl]hexafluoropropane, 2,2-bis[4-(3-aminophenoxy)phenyl]hexafluoropropane,
2,2-bis[4-(4-aminophenoxy)phenyl]hexafluoropropane, and the like.

Examples of diisocyanates which are the compounds represented by the formula (4) wherein the functional group Y is an isocyanate group include those exemplified in the above mentioned diamines in which "amino" is replaced by "isocyanate".

Typical examples of the siloxane compound represented by the formula (5) to be used as a raw material for production of the polyimide wherein the functional group Y is an amino group include the following diamines:
bis(3-aminopropyl)tetramethyldisiloxane, bis(10-aminodecamethylene)tetramethyldisiloxane, aminopropyl terminated dimethylsiloxane tetramer and octamer, bis(3-aminophenoxymethyl)tetramethyldisiloxane and the like. These siloxane compounds may be used as a mixture of two or more thereof.

Examples of diisocyanates which are the siloxane compounds represented by the formula (5) wherein the functional group Y is an isocyanate group include those exemplified in the above mentioned diamines in which "amino" is replaced by "isocyanate".

The diisocyanates wherein the functional group Y in the above mentioned formulas (4) and (5) is an isocyanate group can be easily produced by reacting the above exemplified corresponding diamines with phosgene.

The polyimides used in the present invention can be produced as follows.

In the case of using tetracarboxylic dianhyrides and diamines as the raw materials for the polyimide, it is possible to use the following processes: namely, a process for directly obtaining a polyimide by heating tetracarboxylic dianhyrides and diamines in an organic solvent, optionally in the presence of a catalyst (in an amount of not more than 20 parts by weight of the reactants) such as tributylamine, triethylamine, or triphenyl phosphite to a temperature of not less than 100° C., and preferably not less than 180° C.; a process for obtaining a polyimide by reacting tetracarboxylic dianhyrides with diamines in an organic solvent at a temperature of not more than 100° C. to obtain a polyamic acid which is a precursor of the polyimide, optionally adding a dehydrating agent such as p-toluenesulfonic acid (in an amount of 1 to 5 times the mol of the tetracarboxylic dianhydride), and then heating the solution to cause an imidation reaction, and a process in which the above-mentioned polyamic acid is caused to ring-closure reaction at a relatively low temperature (in a range from room temperature to 100° C.) by adding a dehydrating ring-closure agent such as anhydrides, e.g., acetic anhydride, propionic anhydride or benzoic anhydride, carbodiimide compounds, e.g., dicyclohexylcarbodiimide, and optionally a ring closure catalyst such as pyridine, isoquinoline, imidazole and triethylamine (as for the dehydrating ring closure agent and ring-closure catalyst, in an amount of 2 to 10 times by mol of the tetracarboxylic dianhydrides).

Examples of the organic solvents used in these reactions include aprotic polar solvents such as N-methyl-2-pyrrolidone, N,N-dimethylacetamide, N,N-dimethylformamide, dimethylsulfoxide, sulforane, hexamethylphosphoric acid triamide, and 1,3-dimethyl-2-imidazolidone, and phenol solvents such as phenol, cresol, xylenol, and p-chlorophenol. Optionally, solvents such as benzene, toluene, xylene, methyl ethyl ketone, acetone, tetrahydrofuran, dioxane, monoglyme, diglyme, methyl cellosolve, cellosolve acetate, methanol, ethanol, isopropanol, methylene chloride, chloroform, trichloroethylene, and nitrobenzene can be mixed with the above-mentioned solvents as a mixture.

In the case where tetracarboxylic dianhydrides and diisocyanates are used as the raw materials, the polyimides can be produced according to the above-mentioned process for directly obtaining the polyimide. In this case, the reaction temperature is preferably not less than room temperature, and particularly not less than 60° C. The polyimide having a high polymerization degree can be produced by the reaction between equimolar amounts of the tetracarboxylic dianhydrides and the diamines or diisocyanates. If necessary, it is possible to use either one of them in an excess amount of less than 10% by mol.

Since the film formability depends upon molecular weight of the polyimide used in the present invention, the molecular weight can be optimally decided according to desired film formability. In the present invention, polyimide having too low molecular weight is not preferred, because film formability in some degree and good heat resisting property are required in the adhesive layer when the adhesive tape is used for electronic parts. In the present invention, the number average molecular weight of the polyimide is generally in a range of from 4,000 to 400,000, and preferably from 8,000 to 200,000. If the number average molecular weight is higher than 400,000, processability of the polyimide becomes poor upon producing the adhesive tape because of increasing the viscosity of the fused resin, and the adhesive property deteriorates too.

In the present invention, though one species of the above mentioned polyimides may be used alone in the adhesive layer, two or more species selected from the above described polyimides may be suitably mixed in order to control the glass transition temperature (Tg).

Examples of the silane coupling agent to be contained in the adhesive layer of the adhesive tape for electronic parts according to the present invention include aminosilanes such as N-(2-aminoethyl)-3-aminopropylmethyldimethoxysilane, N-(2-aminoethyl)-3-aminopropyltrimethoxysilane, N-(2-aminoethyl)-3-aminopropylmethyldiethoxysilane, N-(2-aminoethyl)-3-aminopropyltriethoxysilane, 3-aminopropyltrimethoxysilane, 3-aminopropyltriethoxysilane, etc., epoxysilanes such as 3-glycidyloxypropyl-trimethoxysilane, 3-glycidyloxypropyltriethoxysilane, 3-glycidyloxypropylmethyldimethoxysilane, 3-glycidyloxypropylmethyldiethoxysilane, etc., mercaptosilanes such as 3-mercaptopropyltrimethoxysilane, 3-mercaptopropyltriethoxysilane, etc., and vinylsilanes such as 3-methacryloxypropyltriethoxysilane, 3-methacryloxypropyltrimethoxysilane, vinyltrimethoxysilane, vinyl-triethoxysilane, vinyl-tris(2-methoxyethoxy)silane, etc.

The silane coupling agent is added in an amount of 0.1–15 parts by weight and preferably 0.1–5 parts by weight based on 100 parts by weight of the polyimide composing the adhesive layer. If the amount of the silane coupling agent is less than 0.1 parts by weight, it becomes difficult to assure electrical insulation at high temperature because of too high fluidity of the resin and is impossible to assure adhesion strength at high temperature. Moreover, adhesion strength to the base film lowers. If the amount is beyond 15 parts by weight, there are problems that the adhesive is too hard to result in reduction of the adhesion strength or the leadframe is contaminated upon taping or wire-bonding.

In the adhesive tape for electronic parts of the present invention, a filler having a particle size of not more than 1 $\mu$m may be incorporated in the adhesive layer for the purpose of controlling characteristics during the adhering. Examples of the filler which can be used are silica, quarts powder, mica, alumina, diamond powder, zircon powder, calcium carbonate, magnesium oxide, fluorine containing resin, and the like. The content of the filler when being incorporated is preferably from 0.1 to 50 parts by weight, and more preferably from 0.4 to 25 parts by weight, based on 100 parts by weight of the total solid content of the adhesive layer. If the content of the filler exceeds 50 parts by weight, the adhesion strength remarkably lowers. Conversely, if it is less than 0.1 parts by weight, no effect of the addition of the filler can be obtained.

The adhesive tape for electronic parts of the present invention may be produced by various methods. For example, the adhesive tape for electronic parts which has an adhesive layer on one side of the heat resisting film can be produced by a method comprising applying to one side of the heat resisting film a coating varnish containing the above mentioned polyimide, the silane coupling agent and the filler optionally added thereto and drying the resultant coating layer, or a method comprising previously producing an adhesive film comprising the above mentioned polyimide, the silane coupling agent and the filler optionally added thereto and put it on and bonding to the heat-resisting film under pressure with heat. The adhesive tape for electronic parts which has adhesive layers on both sides of the heat resisting film can be produced by a method comprising applying to both sides of the heat resisting film two coating varnishes having each a different glass transition temperature, respectively, and drying the resultant coating layers, and a method comprising previously producing two adhesive films as described above, putting them on both sides of the heat resisting film and bonding them under pressure with heat.

In the adhesive tape for electronic parts of the present invention, the whole thickness which can be suitably varied is generally in a range of 15–250 μm. The adhesive layer however is necessary to have a thickness of 5 μm at the lowest in order to assure the adhesion strength.

In the case that the adhesive layer is formed by application, coating varnishes are used which are obtained by dissolving the above described polyimide and the silane coupling agent in a suitable solvent and, if desired, adding the filler thereto. Examples of the solvents used for dissolving them include various organic solvents such as aprotic polar solvents, e.g., N-methyl-2-pyrrolidone, N,N-dimethylacetamide, N ,N-dimethylformamide, dimethylsulfoxide, sulforane, hexamethylphosphoric acid triamide, and 1,3-dimethyl-2-imidazolidone, phenol solvents such as phenol, cresol, xylenol and p-chlorophenol, etc., isophorone, cyclohexanone, carbitol acetate, diglyme, dioxane, tetrahydrofuran, etc. Moreover, alcoholic solvents such as methanol, ethanol and isopropanol, ester solvents such as methyl acetate, ethyl acetate and butyl acetate, nitrile solvents such as acetonitrile and benzonitrile, aromatic solvents such as benzene, toluene and xylene, halogen solvents such as chloroform and dichloromethane, and the like can be mixed and used in such a degree that the polyimide is not separated. It is preferred to suitably control concentration and viscosity of the coating varnishes depending to the application conditions.

The heat resisting f ilm to be used in the present invention is preferred to have an electrically insulating property. Examples of the heat resisting films include heat-resisting resin film such as those of polyimide, polyphenylene sulfide, polyether, polyparabanic acid, polyethylene terephthalate, etc., and compound heat-resisting films such as epoxy resin-glass cloth, epoxy resin-polyimide-glass cloth, etc. The heat resisting film to be used is preferred to have a thickness of 5–150 μm and particularly 10–75 μm.

In the present invention, it is possible to provide a releasing film having thickness of 1–200 μm as a protective film on the adhesive layer of the adhesive tape. Typical examples of the releasing film used include resin films made of polyethylene, polypropylene, fluorine containing resin, polyethylene terephthalate, polyimide, etc. and paper, and those the surface of which is subjected to releasing treatment with a silicone releasing agent.

As be clear from the results of examination shown hereafter, the adhesive tape for electronic parts of the present invention has excellent heat resistance and adhesive strength, and they do not cause interfacial separation between the adhesive layer and the heat resisting film under circumference of high temperature and high humidity. Therefore, the adhesive tape for electronic parts of the present invention can assure sufficient electrical insulation and very high electrical reliability for adhesion for electronic parts. It can thus be suitably used as an adhesive tape for the innerlead fix of the leadframe and a TAB tape, etc. and can be used for adhering between parts around leadframes making up a semiconductor device, for example, lead pins, semiconductor-mounted substrate, heat spreader, and semiconductor chips themselves.

EXAMPLE

The present invention will now be described in greater detail. First, examples for producing polyimides and coating varnish used in the adhesive layer are illustrated.

Synthetic Example 1

Into a flask equipped with a stirrer were introduced 12.34 g (67 mmol) of 3,4'-diaminobiphenyl, 8.20 g (33 mmol) of 1,3-bis(3-aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone at an iced temperature, and the mixture was stirred for 1 hour. Subsequently, the resultant solution was reacted at room temperature for 3 hours to synthesize a polyamic acid. To the resulting polyamic acid were added 50 ml of toluene and 1.0 g of p-toluenesulfonic acid, the mixture was heated to 160° C. and an imidation reaction was carried out for 3 hours while separating water which was flowed by being azeotropically distilled with toluene. After toluene was distilled off, the resulting polyimide varnish was poured in methanol, followed by separation of the resulting precipitate, pulverization, washing, and drying to obtain 50.0 g (yield: 95%) of a polyimide composed of the above mentioned repeating units in a proportion of (1b):(2a)= 67:33. The IR spectrum measurement of the resultant polyimide showed typical absorption bands of imide at 1718 $cm^{-1}$ and 1783 $cm^{-1}$. The number average molecular weight, glass transition temperature (Tg) and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 2

Using 13.41 g (67 mmol) of 4,4'-oxydianiline, 8.20 g (33 mmol) of 1,3-bis(3-aminopropyl)-1,1,3,3-tetramethyl-disiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=67:33 was obtained in an amount of 51.0 g (yield: 95%) by the same manner as in Synthetic Example 1. The IR spectrum measurement of the resultant polyimide showed typical absorption bands of imide at 1718 $cm^{-1}$ and 1783 $cm^{-1}$. The number average molecular weight, glass transition temperature and temperature of initiating thermal decomposition of the resultant polyimide were determined. The results are shown in Table 1.

The resultant polyimide was dissolved in tetrahydrofuran so as to be the concentration of 25% by weight to produce a polyimide solution.

Synthetic Example 3

Using 13.29 g (67 mmol) of 4,4-diaminodiphenylmethane, 8.20 g (33 mmol) of 1,3-bis(3- aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=67:33 was obtained in an amount of 52.0 g (yield: 97%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in tetrahydrofuran so as to be the concentration of 25% by weight to produce a polyimide solution.

Synthetic Example 4

Using 14.49 g (67 mmol) of 4,4'-diaminodiphenylsulfide, 8.20 g (33 mmol) of 1,3-bis(3-aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=67:33 was obtained in an amount of 51.0 g (yield: 93%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in tetrahydrofuran so as to be the concentration of 25% by weight to produce a polyimide solution.

Synthetic Example 5

Using 16.64 g (67 mmol) of 3,3'-diaminodiphenylsulfone, 8.20 g (33 mmol) of 1,3-bis(3-aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=67:33 was obtained in an amount of 51.5 g (yield: 90%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in tetrahydrofuran so as to be the concentration of 25% by weight to produce a polyimide solution.

Synthetic Example 6

Using 15.16 g (67 mmol) of 2,2-bis(4-aminophenyl)propane, 8.20 g (33 mmol) of 1,3-bis(3-aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=67:33 was obtained in an amount of 54.0 g (yield: 97%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in tetrahydrofuran so as to be the concentration of 25% by weight to produce a polyimide solution.

Synthetic Example 7

Using 22.40 g (67 mmol) of 2,2-bis(4-aminophenyl)hexafluoropropane, 8.20 g (33 mmol) of 1,3-bis(3-aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=67:33 was obtained in an amount of 60.0 g (yield: 95%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in tetrahydrofuran so as to be the concentration of 25% by weight to produce a polyimide solution.

Synthetic Example 8

Using 19.58 g (67 mmol) of 1,4-bis(4-aminophenoxy)benzene, 8.20 g (33 mmol) of 1,3-bis(3-aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=67:33 was obtained in an amount of 58.0 g (yield: 97%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in tetrahydrofuran so as to be the concentration of 25% by weight to produce a polyimide solution.

Synthetic Example 9

Using 19.58 g (67 mmol) of 1,3-bis(4-aminophenoxy)benzene, 8.20 g (33 mmol) of 1,3-bis(3-aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=67:33 was obtained in an amount of 58.0 g (yield: 97%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in tetrahydrofuran so as to be the concentration of 25% by weight to produce a polyimide solution.

Synthetic Example 10

Using 23.08 g (67 mmol) of 1,3-bis[1-(4-aminophenyl)1-methylethyl]benzene, 8.20 g (33 mmol) of 1,3-bis(3-aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):

(2a)=67:33 was obtained in an amount of 62.5 g (yield: 98%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in tetrahydrofuran so as to be the concentration of 25% by weight to produce a polyimide solution.

Synthetic Example 11

Using 24.68 g (67 mmol) of 4,4'-bis(4-aminophenoxy)biphenyl, 8.20 g (33 mmol) of 1,3-bis(3-aminopropyl)-1,1,3,3-tetramethyldisiloxane, 35.83 g (100 nmol) of 3,3',4,4'-diphenylsulfone tetracarboxylic dianhydride and 300 ml of N-methyl-2-pyrrolidone, a polyimide composed of the repeating units in a proportion of (1a):(2a)=67:33 was obtained in an amount of 64.0 g (yield: 98%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in tetrahydrofuran so as to be the concentration of 25% by weight to produce a polyimide solution.

Synthetic Example 12

Using 25.75 g (67 mmol) of 4,4'-bis(4-amino-phenoxy)diphenyl ether, 8.20 g (33 mmol) of 1,3-bis(3-aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=67:33 was obtained in an amount of 64.0 g (yield: 97%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in tetrahydrofuran so as to be the concentration of 25% by weight to produce a polyimide solution.

Synthetic Example 13

Using 28.98 g (67 mmol) of bis[4-(4-aminophenoxy)phenyl]sulfone, 8.20 g (33 mmol) of 1,3-bis(3-aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=67:33 was obtained in an amount of 65.0 g (yield: 94%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in tetrahydrofuran so as to be the concentration of 25% by weight to produce a polyimide solution.

Synthetic Example 14

Using 27.50 g (67 mmol) of 2,2-bis[4-(4-aminophenoxy)phenyl]propane, 8.20 g (33 mmol) of 1,3-bis(3-aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=67:33 was obtained in an amount of 65.0 g (yield: 96%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in tetrahydrofuran so as to be the concentration of 25% by weight to produce a polyimide solution.

Synthetic Example 15

Using 34.74 g (67 mmol) of 2,2-bis[4-(4-amino-phenoxy)phenyl]hexafluoropropane, 8.20 g (33 mmol) of 1,3-bis(3-aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=67:33 was obtained in an amount of 74.0 g (yield: 98%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the resultant polyimide were determined. The results are shown in Table 1.

The resultant polyimide was dissolved in tetrahydrofuran so as to be the concentration of 25% by weight to produce a polyimide solution.

Synthetic Example 16

Using 23.35 g (67 mmol) of 9,9-bis(4-aminophenyl)fluorene, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride and 300 ml of N-methyl-2-pyrrolidone, a polyimide composed of the repeating units in a proportion of (1a):(2a)=67:33 was obtained in an amount of 60.5 g (yield: 95%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 17

Using 13.82 g (75 mmol) of 3,4'-diaminobiphenyl, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of (1b):(2b)=75:25 was obtained in an amount of 54.0 g (yield: 94%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 18

Using 15.02 g (75 mmol) of 4,4'-oxydianiline, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of (1b):(2b)=75:25 was obtained in an amount of 52.0 g (yield: 89%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 19

Using 14.87 g (75 mmol) of 4,4'-diaminodiphenylmethane, 6.21 g (25 mmol) of 1,3-bis(3-aminopropyl)-1,1,3,3-tetra-methyldisiloxane, 41.03 g (100 mmol) of ethylene glycol bistrimellitate dianhydride and 300 ml of N-methyl-2-pyrrolidone, a polyimide composed of the repeating units in a proportion of (1b):(2b)=75:25 was obtained in an amount of 55.0 g (yield: 94%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 20

Using 16.22 g (75 mmol) of 4,4-diaminodiphenylsulfide, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of (1b):(2b)=75:25 was obtained in an amount of 54.0 g (yield: 90%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 21

Using 18.63 g (75 mmol) of 3,3'-diaminodiphenylsulfone, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of (1b):(2b)=75:25 was obtained in an amount of 55.5 g (yield: 89%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 22

Using 16.97 g (75 mmol) of 2,2-bis(4-aminophenyl)-propane, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of (1b):(2b)=75:25 was obtained in an amount of 57.0 g (yield: 94%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 23

Using 25.07 g (75 mmol) of 2,2-bis(4-aminophenyl)-hexafluoropropane, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of (1b):(2b)=75:25 was obtained in an amount of 67.0 g (yield: 98%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 24

Using 21.92 g (75 mmol) of 1,4-bis(4-aminophenoxy)-benzene, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of (1b):(2b)=75:25 was obtained in an amount of 62.0 g (yield: 95%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 25

Using 21.92 g (75 mmol) of 1,3-bis(4-aminophenoxy)-benzene, 6.21 g (25 mmol) of 1,3-bis(3-aminopropyl)-1,1, 3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of (1b):(2b)=75:25 was obtained in an amount of 64.0 g (yield: 97%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 26

Using 25.84 g (75 mmol) of 1,3-bis[1-(4-aminophenyl)-1-methylethyl]benzene, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of (1b):(2b)=75:25 was obtained in an amount of 67.0 g (yield: 96%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 27

Using 27.63 g (75 mmol) of 4,4'-bis(4-aminophenoxy)-biphenyl, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of (1b):(2b)=75:25 was obtained in an amount of 69.5 g (yield: 98%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 28

Using 28.82 g (75 mmol) of 4,4'-bis(4-aminophenoxy)-diphenyl ether, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of (1b):(2b)=75:25 was obtained in an amount of 70.0 g (yield: 97%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 29

Using 32.08 g (75 mmol) of bis[4-(4-aminophenoxy)phenyl]sulfone, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of (1b):(2b)=75:25 was obtained in an amount of 74.0 g (yield: 97%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 30

Using 30.78 g (75 mmol) of 2,2-bis[4-(4-aminophenoxy)phenyl]propane, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of (1b):(2b)=75:25 was obtained in an amount of 73.0 g (yield: 98%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 31

Using 38.89 g (75 mmol) of 2,2-bis[4-(4-amino-phenoxy)phenyl]hexafluoropropane, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of (1b):(2b)=75:25 was obtained in an amount of 80.0 g (yield: 97%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 32

Using 26.14 g (75 mmol) of 9,9-bis(4-aminophenyl)-fluorene, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of (1b):(2b)=75:25 was obtained in an amount of 66.0 g (yield: 95%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 33

Using 20.53 g (50 mmol) of 2,2-bis[4-(4-amino-phenoxy)phenyl]propane, 12.43 g (50 mmol) of 1,3-bis(3-aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=50:50 was obtained in an amount of 61.0 g (yield: 93%) by the same manner as in Synthetic Example 1. The IR spectrum measurement of the resultant polyimide showed typical absorption bands of imide at 1715 $cm^{-1}$ and 1786 $cm^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 34

Using 30.79 g (75 mmol) of 2,2-bis[4-(4-amino-phenoxy)phenyl]propane, 6.21 g (25 mmol) of 1,3-bis(3-aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=75:25 was obtained in an amount of 65.0 g (yield: 94%) by the same manner as in Synthetic Example 1. The IR spectrum measurement of the resultant polyimide showed typical absorption bands of imide at 1720 $cm^{-1}$ and 1783 $cm^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 35

Using 32.84 g (80 mmol) of 2,2-bis[4-(4-amino-phenoxy)phenyl]propane, 4.97 g (20 mmol) of 1,3-bis(3-aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=80:20 was obtained in an amount of 68.0 g (yield: 97%) by the same manner as in Synthetic Example 1. The IR spectrum measurement of the resultant polyimide showed typical absorption bands of imide at 1720 $cm^{-1}$ and 1783 $cm^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 36

Using 36.95 g (90 mmol) of 2,2-bis[4-(4-amino-phenoxy)phenyl]propane, 2.49 g (10 mmol) of 1,3-bis(3-aminopropyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=90:10 was obtained in an amount of 69.0 g (yield: 97%) by the same manner as in Synthetic Example 1. The IR spectrum measurement of the resultant polyimide showed typical absorption bands of imide at 1720 $cm^{-1}$ and 1783 $cm^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 37

Using 30.79 g (75 mmol) of 2,2-bis[4-(4-amino-phenoxy)phenyl]propane, 6.21 g (25 mmol) of 1,3-bis(3-aminopropyl)-1,1,3,3-tetramethyldisiloxane, 17.91 g (50 mmol) of 3,3',4,4'-diphenylsulfone tetracarboxylic dianhydride, 20.53 g (50 mmol) of ethylene glycol bistrimellitate dianhydride and 300 ml of N-methyl-2-pyrrolidone, a polyimide composed of the repeating units in a proportion of [(1a)+(1b)]:[(2a)+(2b)]=75:25 was obtained in an amount of 68.5 g (yield:95%) by the same manner as in Synthetic Example 1. The IR spectrum measurement of the resultant polyimide showed typical absorption bands of imide at 1715 $cm^{-1}$ and 1786 $cm^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 38

Using 30.79 g (75 mmol) of 2,2-bis[4-(4-amino-phenoxy)phenyl]propane, 6.21 g (25 mmol) of 1,3-bis(3-aminopropyl)-1,1,3,3-tetramethyldisiloxane, 8.96 g (25 mmol) of 3,3',4,4'-diphenylsulfone tetracarboxylic dianhydride, 30.77 g (75 mmol) of ethylene glycol bistrimellitate dianhydride and 300 ml of N-methyl-2-pyrrolidone, a polyimide composed of the repeating units in a proportion of [(1a)+(1b)]:[(2a)+(2b)]=75:25 was obtained in an amount of 69.5 g (yield:95%) by the same manner as in Synthetic Example 1. The IR spectrum measurement of the resultant polyimide showed typical absorption bands of imide at 1715 $cm^{-1}$ and 1786 $cm^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 39

Using 30.79 g (75 mmol) of 2,2-bis[4-(4-amino-phenoxy)phenyl]propane, 6.21 g (25 mmol) of 1,3-bis(3-aminopropyl)-1,1,3,3-tetramethyldisiloxane, 26.87 g (75 mmol) of 3,3',4,4'-diphenylsulfone tetracarboxylic dianhydride, 10.26 g (25 mmol) of ethylene glycol bistrimellitate dianhydride and 300 ml of N-methyl-2-pyrrolidone, a polyimide composed of the repeating units in a proportion of [(1a)+(1b)]:[(2a)+(2b)]=75:25 was obtained in an amount of 66.0 g (yield:94%) by the same manner as in Synthetic Example 1. The IR spectrum measurement of the resultant polyimide showed typical absorption bands of imide at 1715 $cm^{-1}$ and 1786 $cm^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 40

Using 30.79 g (75 mmol) of 2,2-bis[4-(4-amino-phenoxy) phenyl]propane, 9.42 g (25 mmol) of 1,3-bis(3-aminophenoxymethyl)-1,1,3,3-tetramethyldisiloxane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=75:25 was obtained in an amount of 69.0 g (yield: 95%) by the same manner as in Synthetic Example 1. The IR spectrum measurement of the resultant polyimide showed typical absorption bands of imide at 1720 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 41

Using 30.79 g (75 mmol) of 2,2-bis[4-(4-amino-phenoxy) phenyl]propane, 9.91 g (25 mmol) of aminopropyl terminated dimethylsiloxane tetramer represented by the following formula (6):

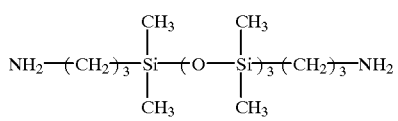

(6)

35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=75:25 was obtained in an amount of 67.0 g (yield: 91%) by the same manner as in Synthetic Example 1. The IR spectrum measurement of the resultant polyimide showed typical absorption bands of imide at 1712 cm$^{-1}$ l and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 42

Using 31.04 g (100 mmol) of 4,4'-diamino-3,3',5,5'-tetraethyldiphenylmethane, 35.83 g (100 mmol) of 3,3',4,4'-diphenylsulfone tetracarboxylic dianhydride and 300 ml of N-methyl-2-pyrrolidone, a polyimide composed of the repeating units in a proportion of (1a):(2a)=100:0 was obtained in an amount of 58.8 g (yield: 93%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 43

Using 15.52 g (50 mmol) of 4,4'-diamino-3,3',5,5'-tetraethyldiphenylmethane, 13.34 g (37.5 mmol) of 3,3',4,4'-diphenylsulfone tetracarboxylic dianhydride, 5.13 g (12.5 mmol) of ethylene glycol bistrimellitate dianhydride and 150 ml of N-methyl-2-pyrrolidone, a polyimide composed of the repeating units in a proportion of (1a):(1b) =75:25 was obtained in an amount of 29.6 g (yield: 92%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 44

Using 15.52 g (50 mmol) of 4,4'-diamino-3,3',5,5'-tetraethyldiphenylmethane, 8.89 g (25 mmol) of 3,3',4,4'-diphenylsulfone tetracarboxylic dianhydride, 10.26 g (25 mmol) of ethylene glycol bistrimellitate dianhydride and 150 ml of N-methyl-2-pyrrolidone, a polyimide composed of the repeating units in a proportion of (1a):(1b)=50:50 was obtained in an amount of 29.6 g (yield: 92%) by the same manner as in Synthetic Example 1. The IR spectrum measurement of the resultant polyimide showed typical absorption bands of imide at 1718 cm$^{-1}$ and $_{1783}$ cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 45

Using 7.76 g (25 mmol) of 4,4'-diamino-3,3',5,5'-tetraethyldiphenylmethane, 6.21 g (25 mmol) of bis(3-aminopropyl) -1,1,3,3-tetramethyldisiloxane, 17.91 g (50 mmol) of 3,3',4,4'-diphenylsulfone tetracarboxylic dianhydride and 150 ml of N-methyl-2-pyrrolidone, a polyimide composed of the repeating units in a proportion of (1a):(2a)=50:50 was obtained in an amount of 27.4 g (yield: 91%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 46

Using 11.64 g (37.5 mmol) of 4,4'-diamino-3,3',5,5'-tetraethyldiphenylmethane, 3.11 g (12.5 mmol) of bis(3-aminopropyl) -1,1,3,3-tetramethyldisiloxane, 17.91 g (50 mmol) of 3,3',4,4'-diphenylsulfone tetracarboxylic dianhydride and 150 ml of N-methyl-2-pyrrolidone, a polyimide composed of the repeating units in a proportion of (1a): (2a)=75:25 was obtained in an amount of 29.6 g (yield:

92%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 47

Using 12.72 g (50 mmol) of 4,4'-diamino-3,3',5,5'-tetramethyldiphenylmethane, 20.51 g (50 mmol) of ethylene glycol bistrimellitate dianhydride and 150 ml of N-methyl-2-pyrrolidone, a polyimide composed of the repeating units in a proportion of (1b):(2b)=100:0 was obtained in an amount of 29.5 g (yield: 94%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

Synthetic Example 48

Using 15.52 g (50 mmol) of 4,4'-diamino-3,3',5,5'-tetraethyldiphenylmethane, 20.51 g (50 mmol) of ethylene glycol bistrimellitate dianhydride and 150 ml of N-methyl-2-pyrrolidone, a polyimide composed of the repeating units in a proportion of (1b):(2b)=100:0 was obtained in an amount of 31.8 g (yield: 93%) by the same manner as in Synthetic Example 1. The IR spectrum measurement of the resultant polyimide showed typical absorption bands of imide at 1718 cm$^{-1}$ and 1783 cm$^{-1}$. The number average molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a polyimide solution.

TABLE 1

| Synthetic Example | (1a):(1b):(2a):(2b) | Number average molecular weight | Glass transition temperature (° C.) | Temperature of initiating thermal decomposition (° C.) |
|---|---|---|---|---|
| 1 | 67:0:33:0 | 39000 | 230 | 452 |
| 2 | 67:0:33:0 | 14000 | 217 | 456 |
| 3 | 67:0:33:0 | 37000 | 180 | 450 |
| 4 | 67:0:33:0 | 13000 | 220 | 451 |
| 5 | 67:0:33:0 | 48000 | 190 | 450 |
| 6 | 67:0:33:0 | 68000 | 190 | 450 |
| 7 | 67:0:33:0 | 40000 | 190 | 455 |
| 8 | 67:0:33:0 | 39000 | 230 | 450 |
| 9 | 67:0:33:0 | 25000 | 192 | 450 |
| 10 | 67:0:33:0 | 38000 | 160 | 450 |
| 11 | 67:0:33:0 | 53000 | 232 | 450 |
| 12 | 67:0:33:0 | 25000 | 230 | 453 |
| 13 | 67:0:33:0 | 12000 | 170 | 450 |
| 14 | 67:0:33:0 | 26000 | 211 | 458 |
| 15 | 67:0:33:0 | 23000 | 201 | 451 |
| 16 | 67:0:33:0 | 36000 | 241 | 452 |
| 17 | 0:75:0:25 | 29000 | 190 | 452 |
| 18 | 0:75:0:25 | 12000 | 177 | 456 |
| 19 | 0:75:0:25 | 27000 | 140 | 455 |
| 20 | 0:75:0:25 | 13000 | 180 | 451 |
| 21 | 0:75:0:25 | 38000 | 150 | 453 |
| 22 | 0:75:0:25 | 58000 | 153 | 453 |
| 23 | 0:75:0:25 | 38000 | 149 | 455 |
| 24 | 0:75:0:25 | 29000 | 190 | 453 |
| 25 | 0:75:0:25 | 15000 | 152 | 454 |
| 26 | 0:75:0:25 | 28000 | 130 | 453 |
| 27 | 0:75:0:25 | 43000 | 182 | 452 |
| 28 | 0:75:0:25 | 22000 | 190 | 453 |
| 29 | 0:75:0:25 | 11000 | 134 | 451 |
| 30 | 0:75:0:25 | 22000 | 171 | 448 |
| 31 | 0:75:0:25 | 21000 | 161 | 454 |
| 32 | 0:75:0:25 | 26000 | 201 | 455 |
| 33 | 50:0:50:0 | 23000 | 180 | 451 |
| 34 | 75:0:25:0 | 45000 | 226 | 465 |
| 35 | 80:0:20:0 | 46000 | 236 | 464 |
| 36 | 90:0:10:0 | 48000 | 248 | 460 |
| 37 | 37.5:37.5:12.5:12.5 | 34000 | 199 | 458 |
| 38 | 18.8:56.2:6.2:18.8 | 31000 | 183 | 455 |
| 39 | 56.2:18.8:18.8:6.2 | 43000 | 220 | 465 |
| 40 | 75:0:25:0 | 44000 | 230 | 455 |
| 41 | 75:0:25:0 | 43000 | 180 | 440 |
| 42 | 100:0:0:0 | 49000 | 282 | 446 |
| 43 | 75:25:0:0 | 81000 | 252 | 420 |
| 44 | 50:50:0:0 | 89000 | 226 | 410 |
| 45 | 50:0:50:0 | 26000 | 186 | 458 |
| 46 | 75:0:25:0 | 69000 | 224 | 421 |
| 47 | 0:100:0:0 | 37000 | 232 | 400 |
| 48 | 0:100:0:0 | 31000 | 200 | 421 |

In the above Table 1, the measurement of the molecular weight of polyimides was carried out by GPC using tetrahydrofuran as an eluent and Shodex 80M X 2 as a column. Value of the molecular weight is a number average molecular weight which is calculated as polystyrene. The glass transition temperature was determined by a differential thermal analysis (in a nitrogen atmosphere, heated at 10° C./min.) and the temperature of initiating thermal decomposition was determined by thermogravimetry (in a nitrogen atmosphere, heated at 10° C./min.)

Production of adhesive tapes:

Example 1

A coating varnish was prepared by adding 0.75 g of 3-aminopropyltriethoxysilane to 1 kg of the polyimide solution obtained in Synthetic Example 1. The resultant coating varnish was applied to a surface of a polyimide film having the thickness of 50 μm by a bar-coater so as to be a dried thickness of 25 μm, and dried in a hot air circulating oven at 150° C. for 5 minutes to form an adhesive layer on one side of the polyimide film. Then, the same coating varnish as mentioned above was applied to the other side of the polyimide film so as to be a dried thickness of 25 μm, and dried in a hot air circulating oven at 150° C. for 10 minutes to produce a both-sided adhesive tape having the total thickness of 100 μm.

Examples 2–48

Coating varnishes were produced by adding silane coupling agents shown in Table 2, respectively, in the amount shown in Table 2. Using these coating varnishes, both-sided adhesive tapes having the total thickness of 100 μm were produced by the same manner as in Example 1.

Example 49

A coating varnish was prepared by adding 0.75 g of 3-aminopropyltriethoxysilane to 1 kg of the polyimide solution obtained in Synthetic Example 45 and adding then a silica filler having a particle size of 0.07 μm (produced by Arakawa Chemical Industries, Ltd.,) in an amount of 10% by weight based on the total solid content. Using the resultant coating varnish, a both-sided adhesive tape was produced by the same manner as in Example 1.

Example 50

A both-sided adhesive tape was produced by the same manner as in Example 49 except that the polyimide solution obtained in Synthetic Example 34 was used.

Example 51

A both-sided adhesive tape was produced by the same manner as in Example 49 except that an alumina filler having a particle size of 0.05 μm (produced by Showa Denko K.K.) was added as a filler in an amount of 10% by weight based on the total solid content.

Example 52

A coating varnish was prepared by adding 0.75 g of 3-aminopropyltriethoxysilane to 1 kg of the polyimide solution obtained in Synthetic Example 14 and adding then a silica filler having a particle size of 0.07 μm (produced by Arakawa Chemical Industries, Ltd.,) in an amount of 0.3% by weight based on the total solid content. Using the resultant coating varnish, a both-sided adhesive tape was produced by the same manner as in Example 1.

Example 53

A both-sided adhesive tape was produced by the same manner as in Example 52 except that the polyimide solution obtained in Synthetic Example 45 was used.

Examples 54–56

Coating varnishes were prepared by adding 12.5 g, 25.0 g or 37.5 g of 3-aminopropyltriethoxysilane to 1 kg of the polyimide solution obtained in Synthetic Example 44. Using the resultant coating varnishes, both-sided adhesive tapes were produced respectively by the same manner as in Example 1.

Example 57

A both-sided adhesive tape was produced by the same manner as in Example 45 except that the polyimide film used had a thickness of 25 μm and the total thickness of the tape was 75 μm.

Example 58

A both-sided adhesive tape was produced by the same manner as in Example 45 except that the polyimide film used had a thickness of 25 μm, the thickness of the adhesive layer was 17 μm and the total thickness of the tape was 59 μm.

Polyimides in the solution, silane coupling agents, fillers and amounts of them used in Examples 1–58 were shown in Table 2.

TABLE 2

| Example | Polyimide | Filler (wt. %) | Silane couplings agent | Parts by weight |
|---|---|---|---|---|
| 1 | Syn. Ex. 1 | 0 | 3-Aminopropyltriethoxysilane | 0.3 |
| 2 | Syn. Ex. 2 | 0 | " | 0.3 |
| 3 | Syn. Ex. 3 | 0 | " | 0.3 |
| 4 | Syn. Ex. 4 | 0 | " | 0.3 |
| 5 | Syn. Ex. 5 | 0 | " | 0.3 |
| 6 | Syn. Ex. 6 | 0 | " | 0.3 |
| 7 | Syn. Ex. 7 | 0 | " | 0.3 |
| 8 | Syn. Ex. 8 | 0 | " | 0.3 |
| 9 | Syn. Ex. 9 | 0 | " | 0.3 |
| 10 | Syn. Ex. 10 | 0 | " | 0.3 |
| 11 | Syn. Ex. 11 | 0 | " | 0.3 |
| 12 | Syn. Ex. 12 | 0 | " | 0.3 |
| 13 | Syn. Ex. 13 | 0 | " | 0.3 |
| 14 | Syn. Ex. 14 | 0 | " | 0.3 |
| 15 | Syn. Ex. 15 | 0 | " | 0.3 |
| 16 | Syn. Ex. 16 | 0 | " | 0.3 |
| 17 | Syn. Ex. 17 | 0 | 3-Glycidyloxypropyl-triethoxysilane | 0.5 |
| 18 | Syn. Ex. 18 | 0 | 3-Glycidyloxypropyl-triethoxysilane | 0.5 |
| 19 | Syn. Ex. 19 | 0 | 3-Glycidyloxypropyl-triethoxysilane | 0.5 |
| 20 | Syn. Ex. 20 | 0 | 3-Glycidyloxypropyl-triethoxysilane | 0.5 |
| 21 | Syn. Ex. 21 | 0 | 3-Glycidyloxypropyl-triethoxysilane | 0.5 |
| 22 | Syn. Ex. 22 | 0 | N-(2-Aminoethyl)-3-aminopropylmethyldimethoxysilane | 0.5 |
| 23 | Syn. Ex. 23 | 0 | N-(2-Aminoethyl)-3-aminopropylmethyldimethoxysilane | 0.5 |
| 24 | Syn. Ex. 24 | 0 | N-(2-Aminoethyl)-3-aminopropylmethyldimethoxysilane | 0.5 |
| 25 | Syn. Ex. 25 | 0 | N-(2-Aminoethyl)-3-aminopropylmethyldimethoxysilane | 0.5 |
| 26 | Syn. Ex. 26 | 0 | N-(2-Aminoethyl)-3-aminopropylmethyldimethoxysilane | 0.5 |
| 27 | Syn. Ex. 27 | 0 | N-(2-Aminoethyl)-3-aminopropylmethyldimethoxysilane | 0.5 |
| 28 | Syn. Ex. 28 | 0 | N-(2-Aminoethyl)-3-aminopropylmethyldimethoxysilane | 0.5 |
| 29 | Syn. Ex. 29 | 0 | N-(2-Aminoethyl)-3-aminopropylmethyldimethoxysilane | 0.5 |
| 30 | Syn. Ex. 30 | 0 | N-(2-Aminoethyl)-3-aminopropylmethyldimethoxysilane | 0.5 |
| 31 | Syn. Ex. 31 | 0 | 3-Aminopropyltriethoxysilane | 0.2 |
| 32 | Syn. Ex. 32 | 0 | " | 0.2 |
| 33 | Syn. Ex. 33 | 0 | " | 0.2 |
| 34 | Syn. Ex. 34 | 0 | " | 0.2 |
| 35 | Syn. Ex. 35 | 0 | " | 0.2 |
| 36 | Syn. Ex. 36 | 0 | " | 0.2 |
| 37 | Syn. Ex. 37 | 0 | 3-Mercaptopropyl-triethoxysilane | 0.2 |
| 38 | Syn. Ex. 38 | 0 | Vinyl-tris(2-methoxy-ethoxy)silane | 1.0 |
| 39 | Syn. Ex. 39 | 0 | Vinyl-tris(2-methoxy-ethoxy)silane | 1.0 |
| 40 | Syn. Ex. 40 | 0 | N-(2-Aminoethyl)-3-aminopropyldimethoxysilane | 0.5 |

TABLE 2-continued

| Example | Polyimide | Filler (wt. %) | Silane couplings agent | Parts by weight |
|---|---|---|---|---|
| 41 | Syn. Ex. 41 | 0 | N-(2-Aminoethyl)-3-amino-propyldimethoxysilane | 0.5 |
| 42 | Syn. Ex. 42 | 0 | N-(2-Aminoethyl)-3-amino-propyldimethoxysilane | 0.5 |
| 43 | Syn. Ex. 43 | 0 | N-(2-Aminoethyl)-3-amino-propyldimethoxysilane | 0.5 |
| 44 | Syn. Ex. 44 | 0 | 3-Glycidyloxypropyl-methyldimethoxysilane | 1.0 |
| 45 | Syn. Ex. 45 | 0 | 3-Aminopropyltriethoxysilane | 0.2 |
| 46 | Syn. Ex. 46 | 0 | " | 0.4 |
| 47 | Syn. Ex. 47 | 0 | " | 0.5 |
| 48 | Syn. Ex. 48 | 0 | " | 5.0 |
| 49 | Syn. Ex. 45 | Silica 10 | " | 0.3 |
| 50 | Syn. Ex. 34 | Silica 10 | " | 0.3 |
| 51 | Syn. Ex. 45 | Alumina 10 | " | 0.3 |
| 52 | Syn. Ex. 14 | Silica 0.3 | " | 0.3 |
| 53 | Syn. Ex. 45 | Silica 0.3 | " | 0.3 |
| 54 | Syn. Ex. 44 | 0 | " | 5.0 |
| 55 | Syn. Ex. 44 | 0 | " | 10 |
| 56 | Syn. Ex. 44 | 0 | " | 15 |
| 57 | Syn. Ex. 45 | 0 | " | 0.2 |
| 58 | Syn. Ex. 45 | 0 | " | 0.2 |

Comparative Examples 1–4

Using the polyimide solutions obtained in Synthetic Examples 1, 14 and 42, adhesive tapes for comparison were produced by the same manner as in Example 1 except that the silane coupling was not added.

Comparative Example 5

An adhesive tape for comparison was produced by the same manner as in Example 1 except that the amount of the silane coupling agent in Example 45 was 20 parts by weight.

Polyimides in the solutions, silane coupling agent, filler and amounts of them used in Comparative Examples 1–5 were shown in Table 3.

TABLE 3

| Comparative Example | Polyamide | Filler (wt. %) | Silane couplings agent | Parts by weight |
|---|---|---|---|---|
| 1 | n. Ex. 1 | 0 | None | 0 |
| 2 | n. Ex. 14 | 0 | None | 0 |
| 3 | n. Ex. 42 | 0 | None | 0 |
| 4 | n. Ex. 45 | 0 | None | 0 |
| 5 | Syn. Ex. 45 | 0 | 3-Aminopropyl-triethoxysilane | 20 |

In order to evaluate the adhesive tapes obtained in the Examples and Comparative Examples, the following operations was carried out.
(Assembling of Leadframe)

Figure 2:
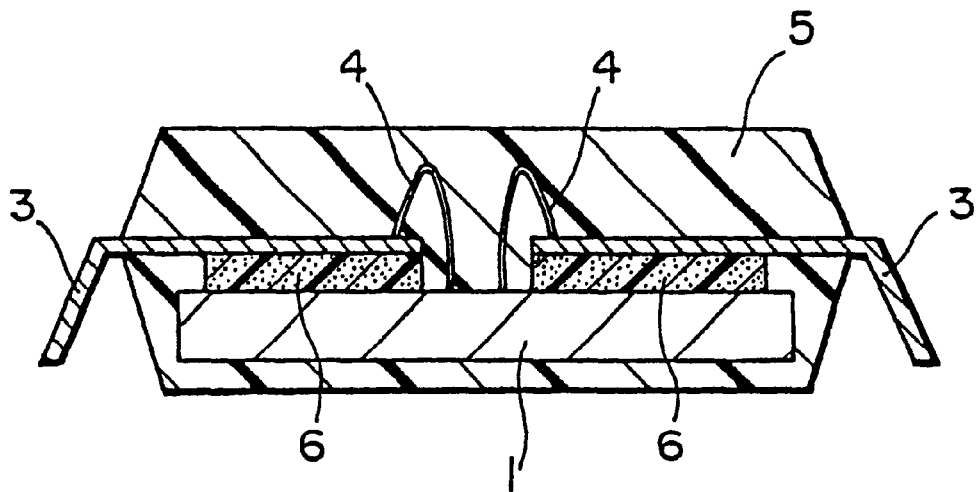
FIG. 2 is a cross-sectional view of an embodiment of a resin-molded type semiconductor device using the adhesive tape of the present invention or the prior conventional adhesive tape.
Figure 3:
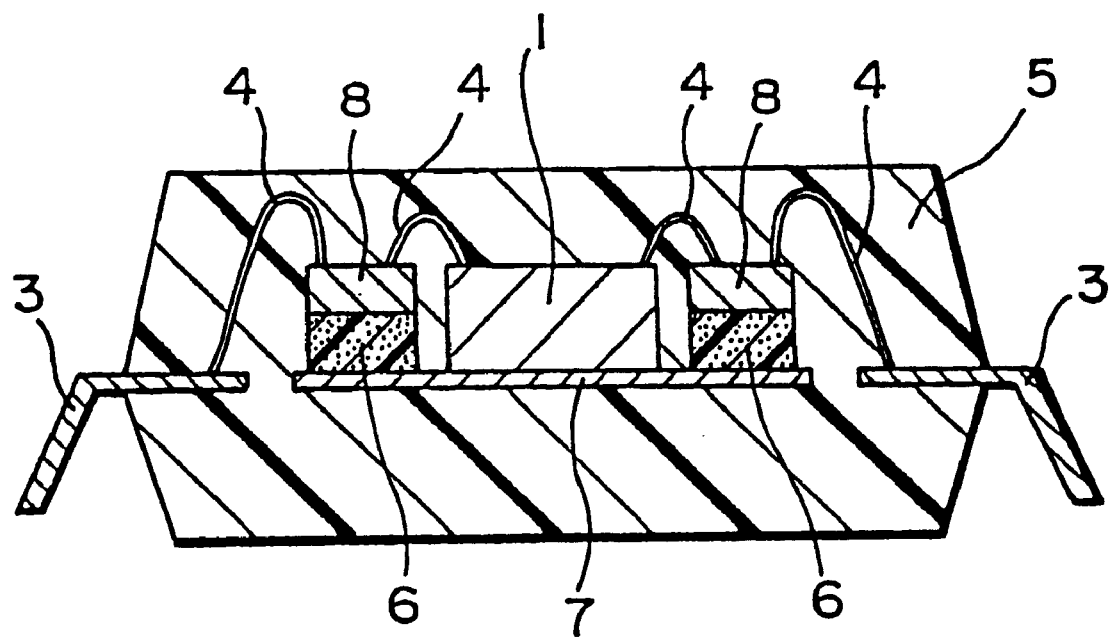
FIG. 3 is a cross-sectional view of an embodiment of a resin-molded type semiconductor device using the adhesive tape of the present invention or the prior conventional adhesive tape.

A leadframe used in a semiconductor package as shown in FIG. 2 was assembled according to the following procedures.

(a) Punching of Adhesive Tape

The adhesive tape was subjected to punch dying in a desired form by a mold.

(b) Assembling of Leadframe

The adhesive tape punched and a leadframe were positioned and heated under pressure (4 kgf/cm$^2$/1 second in nitrogen atmosphere) on a hot plate heated. The adhesion temperature in this stage was controlled so as to be 100° C. lower than Tg of the polyimide used in each adhesive layer.
(Assembling of Semiconductor Package)

Thereafter, the produced leadframe was used to assemble a semiconductor package according to the following stages (c)–(f).

(c) Die Bonding

A semiconductor chip was allowed to adhere to a predetermined position on the leadframe at a temperature of 100° C. higher than Tg of the polyimide used in each adhesive layer under conditions of 2 kgf/cm$^2$/2 seconds in nitrogen atmosphere.

(d) Wire Bonding

Using a wire bonder, a wire pad on the semiconductor chip and a silver plated portion at the end of the inner lead were connected with a gold wire.

(e) Molding

Using an epoxy molding compound, transfer molding was carried out.

(f) Finishing Stage

Via stages of forming, dum cutting, solder plating on the outer leads, etc., the packaging was finished.
(The Results of Evaluations of Adhesive Tapes and Semiconductor Packages (n=10))

(A) Adhesion strength

A 90° C. peel strength of 10 mm wide tape at room temperature was measured after the adhesive tape was adhered (taped) onto a copper plate under the same condition at assembling the leadframe. As the result, the adhesive tapes of Examples 1–58 were found to have the strength ranging from 35–50 g/10 mm, while the adhesive tapes of Comparative Examples 1–4 had the strength of 25–50 g/10 mm which meant large variation and found to cause separation between the adhesive layer and the base film. The adhesive tapes of Comparative Example 5 had the strength of 10–35 g/10 mm which meant poor adhesive strength with large variation.

(B) Embedding of Lead pins

Embedding of Lead pins was evaluated by measuring a distance between the chip and the leadframe after die bonding. As a result, in the case of using the adhesive tapes of Examples 1–58, the distance changed in a range of ±10 μm from the thickness of the tape. In the case of using the adhesive tapes of Comparative Examples 1–5, the change of the distance was ±20 μm from the thickness of the tape, which meant poor accuracy of the thickness of the adhesive tape.

(C) Evaluation of Semiconductor packages

The package obtained as described above were tested using the PCBT Test (Pressure Cooker Biased Test). This test was carried out at 5 volts of applied voltage at 121° C., at 2 atmospheres and at 100% relative humidity, in order to test electrical reliability. As the result, the adhesive tapes of Examples 1–58 did not cause shorting even after 1,000 hours. On the contrary, 3 samples caused interfacial separation between the polyimide film and the adhesive layer in case of the adhesive tape of Comparative Example 1–5, respectively, though no shorting occurred. When the thermal cycle test was carried out at −50° C.−+160° C., a change was not observed after lapse of 1000 cycles in case of Examples 1–58, but 8 samples caused interfacial separation between the polyimide film and the adhesive layer in case of Comparative Examples 1–5.

As is clear from the results described above, in the case of the adhesive tapes of the present invention, the semiconductor package can be produced in a good manner. In contrast, the adhesive tapes of Comparative Examples are not suitable for manufacturing electronic parts because of causing troubles that the lead pins are embedded in the adhesive layers, shorting is caused by the test for electrical reliability, or the adhesive tape has large variation of adhesive strength.

What is claimed is:

1. An adhesive tape for electronic parts comprising a heat resisting film and an adhesive layer provided on at least a side of said heat resisting film, wherein said adhesive layer contains at least a polyimide comprising 100–30% by mol of at least one of the repeating units represented by the following formulas (1a) and (1b) and 0–70% by mol of at least one of the repeating units represented by the following formulas (2a) and (2b) and 0.1–15 parts by weight of a silane coupling agent based on 100 parts by weight of said polyimide:

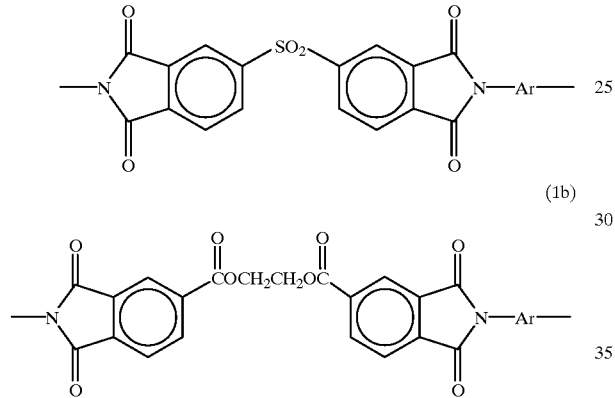

wherein Ar represents a divalent group selected from the following formulas containing aromatic rings:

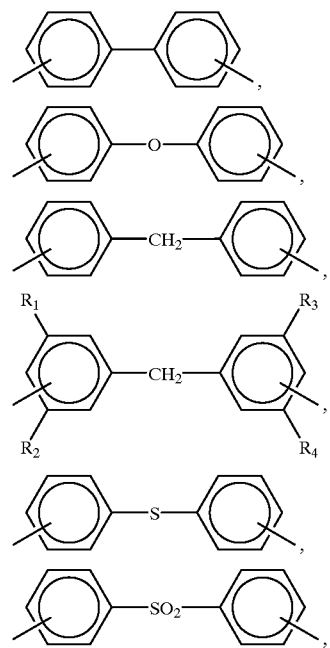

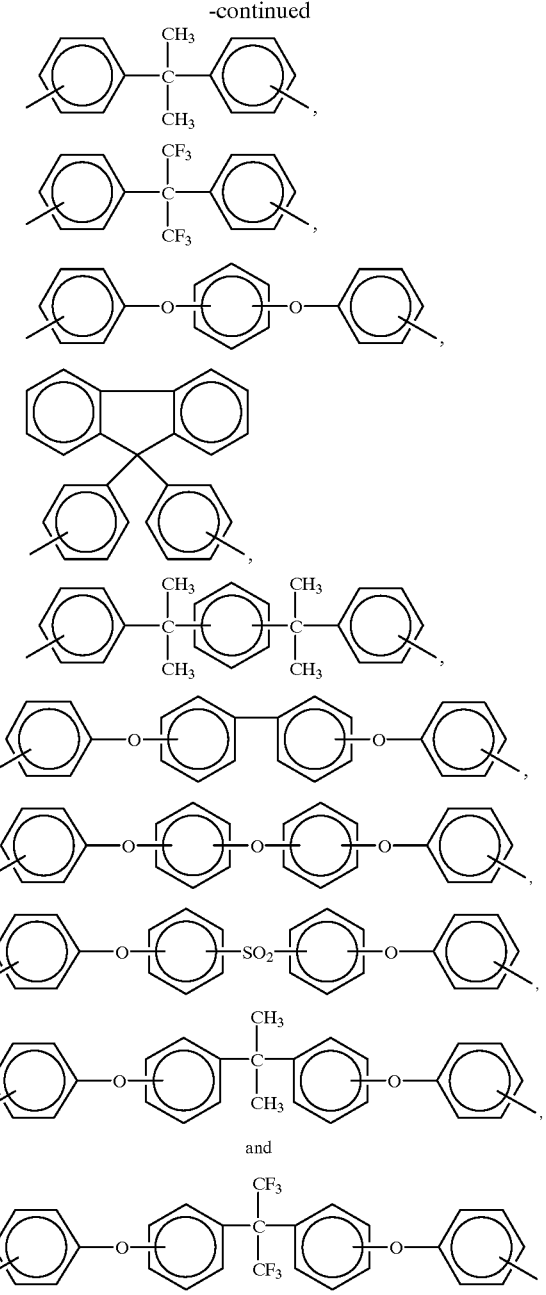

wherein $R_1$, $R_2$, $R_3$ and $R_4$ which may be identical or different represent each a hydrogen atom, an alkyl group having 1–4 carbon atoms or an alkoxy group having 1–4 carbon atoms, provided that $R_1$, $R_2$, $R_3$ and $R_4$ are not hydrogen atoms at the same time:

(2a)

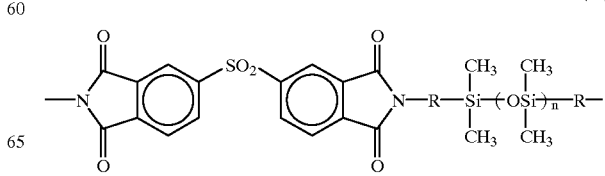

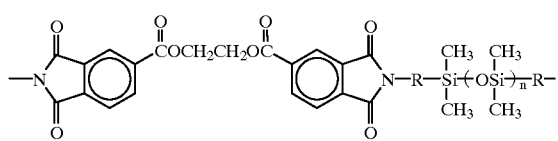 (2b)

wherein R is an alkylene group having 1 to 10 carbon atoms or —CH$_2$OC$_6$H4—, the methylene group of which attaches to Si, and n means an integer of 1 to 20.

2. The adhesive tape for electronic parts according to claim 1 wherein said heat resisting film is a polyimide film.

3. The adhesive tape for electronic parts according claim 1 wherein said silane coupling agent in the adhesive layer is an alkoxysilane coupling agent.

4. The adhesive tape for electronic parts according to claim 1 wherein said adhesive layer contains 0.1–50 parts by weight of a filler having a particle size of not more than 1 μm.

5. The adhesive tape for electronic parts according to claim 1 wherein a releasing film is provided on said adhesive layer.

* * * * *